United States Patent
Lee et al.

(10) Patent No.: US 7,453,058 B2
(45) Date of Patent: Nov. 18, 2008

(54) OPTICAL BUMPS FOR LOW-LOSS INTERCONNECTION BETWEEN A DEVICE AND ITS SUPPORTED SUBSTRATE AND RELATED METHODS

(75) Inventors: Michael G. Lee, San Jose, CA (US); Kishio Yokouchi, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 185 days.

(21) Appl. No.: 11/080,200

(22) Filed: Mar. 15, 2005

(65) Prior Publication Data

US 2006/0208165 A1  Sep. 21, 2006

(51) Int. Cl.
*H01J 5/02* (2006.01)

(52) U.S. Cl. .................... 250/239; 250/227.21

(58) Field of Classification Search .......... 250/551, 250/227.22, 239, 227.21, 216, 208.1; 385/51; 356/618, 619, 621; 257/433
See application file for complete search history.

(56) References Cited

U.S. PATENT DOCUMENTS

| | | | | |
|---|---|---|---|---|
| 4,058,821 A | * | 11/1977 | Miyoshi et al. | 257/82 |
| 4,143,385 A | * | 3/1979 | Miyoshi et al. | 257/82 |
| 4,268,113 A | * | 5/1981 | Noel, Jr. | 385/92 |
| 4,650,277 A | * | 3/1987 | Husher et al. | 385/26 |
| 6,259,840 B1 | * | 7/2001 | Munoz-Bustamante et al. | 385/39 |
| 6,773,169 B2 | * | 8/2004 | Ebeling et al. | 385/88 |
| 6,987,906 B2 | * | 1/2006 | Nakama et al. | 385/31 |
| 7,111,992 B2 | * | 9/2006 | Kaneko | 385/88 |

* cited by examiner

*Primary Examiner*—Que T Le
(74) *Attorney, Agent, or Firm*—Baker Botts L.L.P.

(57) ABSTRACT

The present invention is directed to an apparatus and related methods related to an optical bump for optically coupling devices. An exemplary apparatus includes a first device, a second device, and at least one optical bump. The first device has a first surface including at least one first optically active area. The second device has a second surface including at least one second optically active area positioned in an opposed and spaced-apart relationship with respect to the at least one first optically active area. The first surface is separated from the second surface by a distance. The at least one optical bump is coupled to the first surface between the at least one first optically active area and the at least one second optically active area. The at least one optical bump has a height that is less than the distance between the first surface and the second surface. The at least one optical bump is configured to couple light between the at least one second optically active area and the at least one first optically active area.

13 Claims, 5 Drawing Sheets

OPTICAL BUMPS FOR LOW-LOSS INTERCONNECTION BETWEEN A DEVICE AND ITS SUPPORTED SUBSTRATE AND RELATED METHODS

FIELD OF THE INVENTION

The invention relates generally to the field of interconnecting semiconductor devices. In particular, the invention is directed to devices and methods for optically coupling optoelectronic components.

BACKGROUND OF THE INVENTION

The growth of networks that are capable of handling the high data-rate transfer of voice and data signals has created a demand for optical networks. While information can be transferred optically over long distances, there is also a need for interfacing the optical portions of an optical network with electrical and electro-optical components. Thus, for example, optical networks include amplifiers for strengthening optical beams, switches for routing signals, and conversions between electrical and optical signals at either end of the network. These functions are performed by devices that include optical, electro-optical, and electrical components.

As is the case with electronic components, it is advantageous to arrange optical components and electro-optical components in a chip-like configuration that facilitates the optical and electrical interconnection between the components. More specifically, the arrangement of optical components and/or optoelectronic components, e.g., optoelectronic integrated circuits ("OEICs"), in a chip-like configuration can include the optical coupling of one optical or electro-optical component, or chip, to one another chip at the semiconductor-package level, i.e., from a first chip to a second chip, and at the circuit-board level, i.e., from a chip to a substrate.

Numerous methods have been proposed for the optical interconnection of integrated circuit chips ("ICs" or "chips"). Each of these methods has problems associated with alignment of the optical beam between the components, and/or problems associated with optical-beam transmission losses. Additional problems associated with these methods include the cost of the methods, and the manufacturing difficulty associated with the methods. Other problems occur when attempts are made to scale the proposed methods in order to accommodate a large number of optical beams.

For example, optical signal communication between two optical components can be conducted by first performing an electro-optic ("EO") conversion of an electrical signal to an optical signal using a first complementary metal oxide semiconductor ("CMOS") chip that is coupled to a vertical cavity surface emitting laser ("VCSEL") chip, which functions as the light source. The resulting light beam is coupled from the VCSEL chip into a photodetector ("PD") that is housed within yet another chip. The PD performs an optoelectric ("OE") conversion of the received optical signal, resulting in an electrical signal that is transmitted to a second CMOS chip.

Referring to the IC package 10 shown in the vertical cross-sectional view of FIG. 1, an electro-optical chip 12 is positioned over a substrate 14, and the chip is both coupled to, and spaced apart from, the substrate using a ball grid array ("BGA") 16 (only one solder bump of the ball grid array is shown). A light emitting component within the chip is aligned with a mirror 18 that is internal to the substrate. Signals are transmitted optically between the chip and the substrate via an optical beam 20 without an intervening material, that is, the optical interconnection between the chip and the substrate is through free space (air). Since there is nothing to guide the beam between the chip and the substrate, such an optical coupling scheme is susceptible to optical losses, mostly due to component misalignment and the divergence of the light beam.

In the case of two optoelectronic integrated circuits ("OEICs") 12 that are connected together, the optical signals are coupled directly from one chip to the other chip, without OE conversion and/or the EO conversion by a separate VCSEL chip and/or a PD. In the case where a chip 12 is coupled to a substrate 14, the substrate typically is equipped with at least one mirror 18 and a waveguide 22, which combine to facilitate the propagation of optical signals from point to point within the substrate. The transmission distance for the optical signals within the substrate can be a much longer distance, e.g., approximately 100 millimeters ("mm"), than the optical-coupling distance "X" between the chip and the substrate, e.g., approximately 100 micrometers ("µm").

The packaging orientation of an optically coupled chip 12 and substrate 14, in a sense, is similar to the conventional flip-chip packaging of electronic chips , e.g., CMOS chips, to a substrate, which typically is accomplished using a BGA 16.

The optical interface(s) 24 between two optical devices 12 and 14 likely coexist with electrical joints 16, because all of the aforementioned components require electric inputs and outputs in addition to the optical signal inputs and outputs. The electrical joints can be common solder bumps, pull-up solder pillars, or conductive adhesive (not shown). All of these types of electrical connectors are from approximately 80 µm to approximately 1200 µm in height.

As a result of the height of the electrical joints 16 between the devices 12 and 14, the width of an optical beam 20 output from one of the components 12 increases before the optical beam is received by another component 14. For example, in the case of a VCSEL chip, the optical beam width at the output of the chip can be approximately 20 µm and the divergence angle of the optical beam can range from approximately 9° to approximately 15°. Accordingly, the greater the distance between the component 12 that outputs the beam and the component 14 that receives the beam, the wider the width of the beam when the beam is received.

For the above example, it is estimated that an optical beam 20 output from the VCSEL chip can diverge to wider than 30 µm in diameter at the point where the beam is received by the other component, when the distance between the devices, which is determined by the height X of the solder joint(s) 16 (only one shown) between the devices, is more than approximately 40 µm. As shown in FIG. 1, once the width W of the beam becomes wider than the transverse surface area of the mirror 18 included in the substrate 14, the mirror and waveguide 22 within the substrate no longer receive all of the light output from the chip 12. Accordingly, optical signal loss can occur for the system shown in FIG. 1.

Referring additionally to vertical cross-sectional view of FIG. 2, in an effort to reduce the optical losses due to the divergence of the beam 20, microlenses 26 (only one lens is shown) may be introduced into the optical interface 24 between the devices 12 and 14, e.g., the chip and the substrate, in an effort to collimate, or converge, the beam. The microlenses are useful because they can be used to self-adjust the beam's focus when a minor shift in position occurs between the two devices. However, microlenses are problematic because they are costly, they need to be meticulously aligned with the other components, and they characteristically have backreflections that result in additional optical loss.

Free-space transmission of the optical signal between two optical components 12 and 14 is common, because free-space transmission configurations are simple and economical to create. However, because there is no physical joint between the two devices, the stability and reliability of the free space optical interface 24 can be compromised when moisture and/or dust particles get trapped between the two components.

In other efforts to reduce the optical losses due to the divergence of the beam 20 and the collection of moisture and dust, an optical polymer material has been connected between the components 12 and 14, with the polymer material acting as the optical transmission path, i.e., an optical waveguide, between the components. However, the polymer material, often in the form of bumps or balls, hardens as it cures. Because the polymer material is hard after the curing process is complete, and the polymer material is connected to both devices, the interface between the devices is not reworkable.

Reworkability of the interface 24 between the chip 12 and the substrate 14 is desirable because neither of the devices has a 100% yield. In some cases, neither of the devices, nor the combination of the two devices, can be tested before they are physically coupled together, e.g., soldered together. Even with known good dies, the optical interfaces between the two devices still need to be reworkable, because assembly yield is not always 100%. Furthermore, the shape of the polymer material can change over time, e.g., due to creeping or collapse, thus, adding to the difficulties associated with the use of polymer material that is physically connected to both of the devices.

Therefore, it would be desirable to have an optical coupling interface and related method that: (1) are compatible with existing interconnect technology, (2) result in minimal optical signal loss, (3) are reliable, (4) are reworkable, (5) are relatively inexpensive, (6) do not require extensive processing, (7) prevent the accumulation of moisture and/or particles in the optical path between the components, and (8) can be scaled for devices that transmit many optical beams 20, without the need for a microlens. The present invention satisfies these needs.

SUMMARY OF THE INVENTION

Embodiments of the present invention provide optical interconnections and methods for providing optical interconnections between optical or electro-optical components that are compatible with existing interconnect technology, minimize optical signal loss, have a high level of reliability, are reworkable and inexpensive, do not require extensive component processing, can prevent the accumulation of moisture and/or particles between the components, and can be scaled for devices that transmit multiple optical beams.

It is one aspect of the present invention to provide an apparatus including a first device, a second device, and at least one optical bump. The first device has a first surface that includes at least one first optically active area. The second device has a second surface that includes at least one second optically active area positioned in a spaced-apart and opposed relationship with respect to the at least one first optically active area. The first surface is separated from the second surface by a distance. The at least one optical bump is coupled to the first surface between the at least one first optically active area and the at least one second optically active area. The at least one optical bump has a height that is less than the distance between the first surface and the second surface. The at least one optical bump is configured to couple light between the at least one second optically active area and the at least one first optically active area.

In further aspects of the present invention, the first device includes a photodiode, and the second device includes a laser or a light emitting diode. Also, the first surface and the second surface can be oriented approximately parallel to one another, and the first surface and the second surface can be separated from one another by a distance ranging from approximately 10 μm. to approximately 150 μm. In addition, the second device can be configured to transmit light from the at least one second optically active area, and the at least one optical bump can be configured to receive the light output from the second device through the at least one second optically active area, and to couple the light into the first device through the at least one first optically active area. Also, the apparatus can further include at least one solder bump that contacts both the first device and the second device.

In further aspects of the present invention, the apparatus further includes a gel coupled between the second surface and the at least one optical bump. Also, the gel can be an index matching fluid. In addition, the second device can be configured to transmit light from the at least one second optically active area, and the gel can be configured to couple the light transmitted from the at least one second optically active area into the at least one optical bump, when the at least one second optically active area is not aligned with the at least one first optically active area.

In further aspects of the present invention, the apparatus further includes a cladding layer formed from a cladding material that covers at least a portion of the at least one optical bump. Also, the cladding material can be an optical grade polymer. In addition, the apparatus can include underfill located between the first surface and the second surface, wherein the cladding layer prevents the underfill from contacting the at least one optical bump. Furthermore, the at least one optical bump can be formed from a material selected from the group consisting of polyurethane, polycarbonate, acrylic polymer, vinyl polymer, heat-curable polymer, photosensitive polymer, and photobleachable polymer.

In further aspects of the present invention, the second device is configured to transmit light from the at least one second optically active area. The first device includes a mirror and a waveguide, where the mirror is optically aligned with the at least one first optically active area, and the waveguide is optically aligned with the mirror and configured to facilitate the propagation of light. The light that is transmitted from the at least one second optically active area, and coupled into the first device through the first optically active area, is reflected from the mirror and coupled into the waveguide.

It is yet another aspect of the present invention to provide an apparatus including a first device, a second device, and at least one optical bump. The first device has a first surface that includes at least one first optically active area. The second device is configured to be electrically coupled to the first device. The second device has a second surface that includes at least one second optically active area positioned in a spaced-apart and opposed relationship with respect to the at least one first optically active area. The at least one optical bump is coupled to the first surface between the at least one first optically active area and the at least one second optically active area. The at least one optical bump extends from the first surface to the second surface. The at least one optical bump is rigid and configured both to couple light between the at least one second optically active area and the at least one first optically active area, and to act as a stand-off between the first surface and the second surface when the first device is electrical coupled to the second device.

In further aspects of the present invention, the at least one optical bump is configured to space the second device apart from the first device so that the second surface is approximately parallel to the first surface. Also, the apparatus can further include at least one solder bump that electrically couples the first device to the second device.

It is yet another aspect of the present invention to provide an optical bump that is configured to couple light into a first optically active area in a first surface of a first device from a second optically active area in a second surface of a second device. The first surface is separated from the second surface by a distance. The optical bump includes an optical material built upon the first surface adjacent to the first optically active area. The optical material extends away from the first surface and has a height less than the distance between the first surface and the second surface.

In further aspects of the present invention, the optical material is an optical polymer. Also, the optical polymer can be selected from the group consisting of polyurethane, polycarbonate, acrylic polymer, vinyl polymer, heat-curable polymer, photosensitive polymer, and photobleachable polymer. In addition, the optical material can be configured to have a transverse cross-sectional shape selected from the group consisting of a circle, an ellipse, a square, and a rectangle.

It is yet another aspect of the present invention to provide a method for forming an optical bump on a device having a surface that includes an optically active area. The method includes the following: providing a curable liquid; coating a region of the surface with the curable liquid adjacent to the optically active area; curing a portion of the liquid, resulting in a cured portion of the liquid and an uncured portion of the liquid; removing the uncured portion of the liquid, and exposing the cured portion of the liquid; and polishing the cured portion of the liquid.

In further aspects of the present invention, the curing step includes heating the portion of the liquid to a temperature ranging from approximately 20° C. to approximately 200° C. Also, the curing step can include exposing the portion of the liquid to actinic radiation. In addition, the liquid can be a photobleachable polymer or a photosensitive polymer.

In further aspects of the present invention, the curing and removal steps of the method include the following: partially curing the liquid; further curing a portion of the partially cured liquid, resulting in a cured portion of the liquid and an uncured portion of the liquid; removing the uncured portion of the liquid, and exposing the cured portion of the liquid; and performing additional curing on the cured portion of the liquid. Also, the partial curing step includes heating the liquid at a temperature ranging from approximately 80° C. to approximately 100° C.

It is yet another aspect of the present invention to provide a method for forming an optical interface between a first device having a first surface that includes a first optically active area and a second device having a second surface that includes a second optically active area. The method includes the following: providing a curable liquid; coating a region of the first surface adjacent to the first optically active area with the curable liquid; curing a portion of the liquid, resulting in a cured portion of the liquid and an uncured portion of the liquid; removing the uncured portion of the liquid, and exposing the cured portion of the liquid; polishing the cured portion of the liquid, resulting in an optical bump; and positioning the first device and the second device so the first optically active area is in a spaced-apart and opposed relationship with respect to the second optically active area.

In further aspects of the present invention, the curing step includes exposing the portion of the liquid to actinic radiation that is output from the first optically active area. Also, the method can further include adding a gel between the second surface and the optical bump. In addition, the method can further include providing a cladding material, and covering at least a portion of the optical bump with a coating of the cladding material after the polishing step. Furthermore, the method can further include connecting the optical bump to the second surface. Also, the method can further include adding underfill between the first surface and the second surface.

These features, together with the various ancillary provisions and features, which will become apparent to those skilled in the art from the following detailed description, are attained by the optical coupling structures and methods of manufacturing those structures of the present invention, preferred embodiments thereof being shown with reference to the accompanying drawings, by way of example only.

BRIEF DESCRIPTION OF THE DRAWINGS

The foregoing aspects of the attendant advantages of this invention will become more readily apparent by reference to the following detailed description when taken in conjunction with the accompanying drawings wherein.

Reference symbols are used in the figures to indicate certain components, aspects or features shown therein, with reference symbols common to more than one figure indicating like components, aspects or features shown therein.

DETAILED DESCRIPTION

The present invention is directed to optical interconnect structures, and methods of manufacturing such structures, for coupling optical components, such as photodiodes, lasers, light emitting diodes, and the like, that are mounted to, or formed in, different optical or electro-optical devices. An optical device may incorporate a plurality of such active optical components to permit optical communications between the device and other optical devices. In particular, the invention is an optical bump that functions as a waveguide, and is positioned between the optical devices so as to facilitate the exchange of optical signals between the devices. The optical bump is configured to minimize optical signal losses. The exemplary embodiments discussed herein illustrate the optical bump of the present invention, and are not intended to limit the scope of the present invention.

In general, the optical bump of the present invention is made from materials, for example, optical polymers, which facilitate the transmission of light through the optical bump. The optical bump can be surrounded by free space or other materials, for example, cladding material or underfill material, that do not interfere with the transmission of light through the optical bump.

Figure 1:
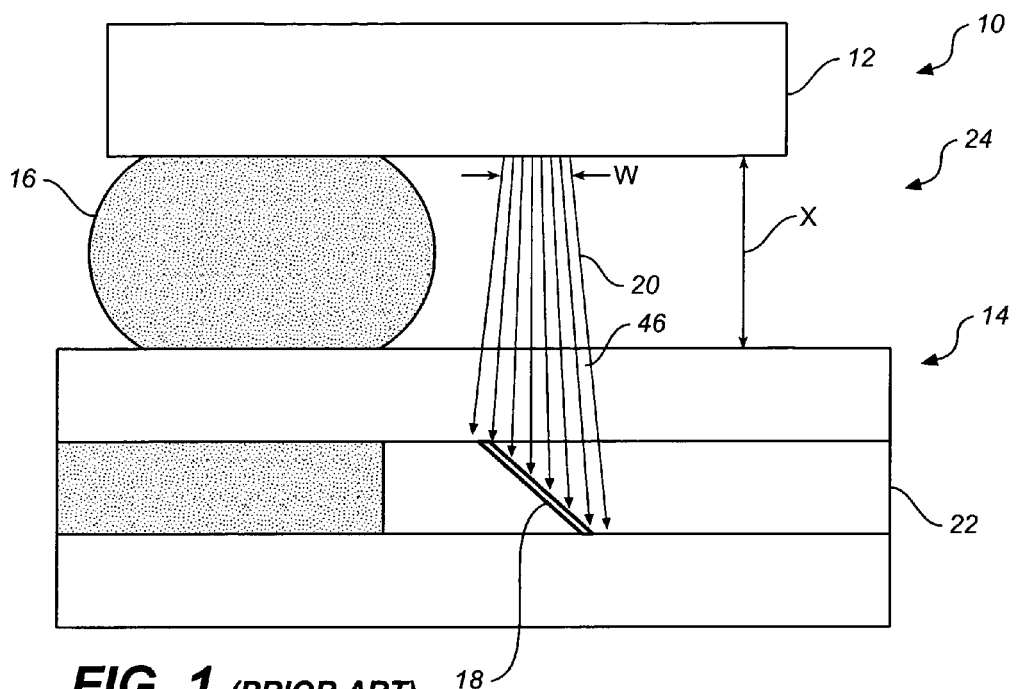
FIG. 1 is a schematic cross-sectional view of a prior art free-space optical transmission path between two devices.
Figure 2:
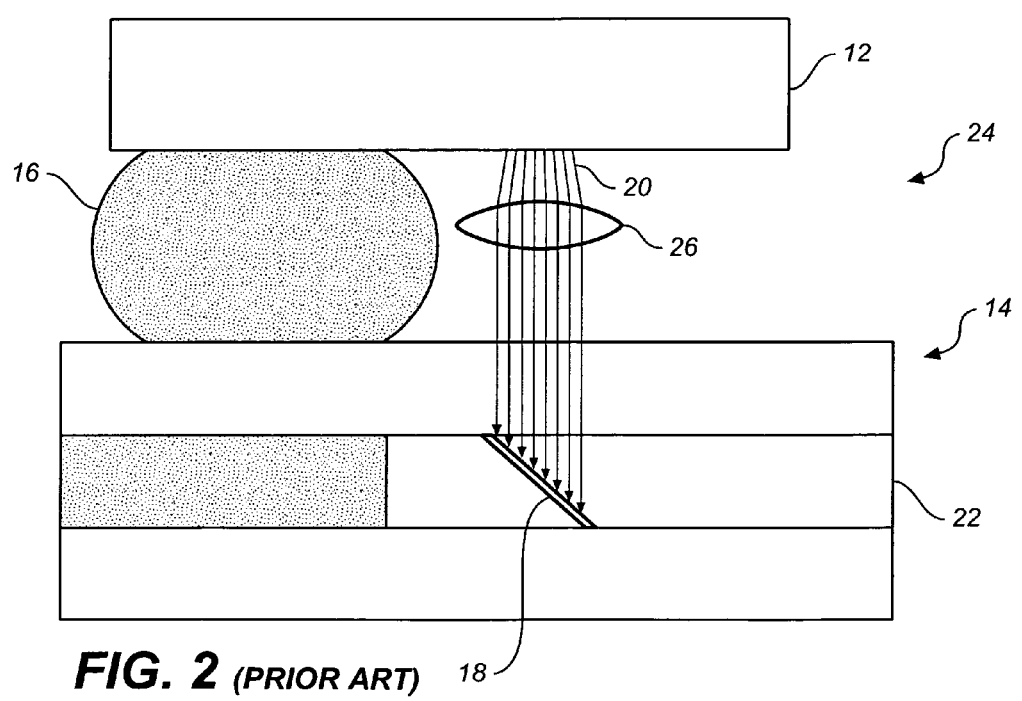
FIG. 2 is a schematic cross-sectional view of a two optically coupled devices of FIG. 1 with a microlens of the prior art positioned within the optical transmission path between the two devices.
Figure 3:
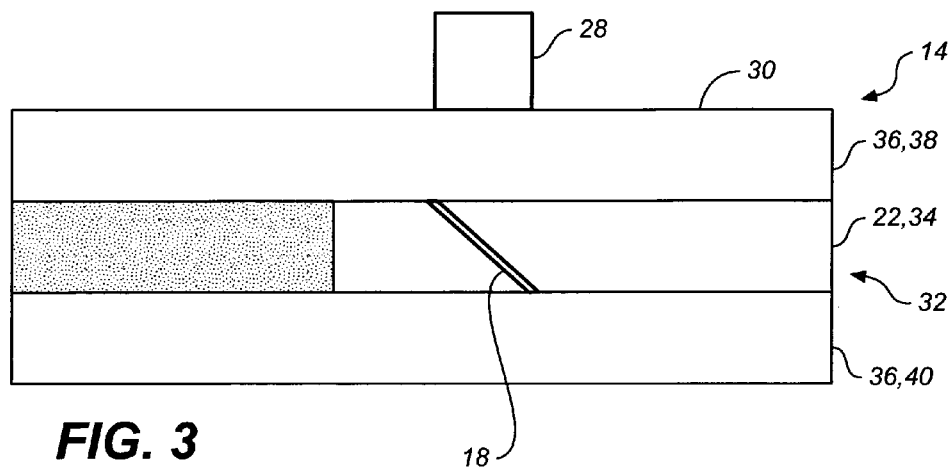
FIG. 3 is a schematic cross-sectional view of an optical bump coupled to a top surface of a substrate according to a preferred embodiment.

Referring now to the figures in combination with the description hereinafter presented, and wherein similar parts of the embodiments of the present invention are identified with like reference numbers, FIG. 3 is a cross-sectional view an optical bump 28 coupled to a top surface 30 of a device 14, also referred to herein as a first device, e.g., a substrate, according to a preferred embodiment of the present invention. Although only one optical bump is shown coupled to the substrate's top surface, two or more optical bumps can be coupled to the substrate's top surface.

The substrate 14, which may be an optical circuit board preferably includes electrical wiring (not shown) in addition to optical components 18 and 22. In particular, the substrate shown in FIG. 3 is a multi-layer printed circuit board device that includes an optical layer 32 with an embedded waveguide core 34 configured for the transmission and routing of light beams through the substrate. The substrate can also include active optical components such as photodiodes, semiconductor lasers, light emitting diodes, photodetectors and the like, which each include an optically active area(s). As used herein, the term "optically active area" means an area located in the surface of a device 12 and 14 or component through which light can propagate for optical communication with another optical component or device. Light propagates through an optically active area in a direction that is generally perpendicular the plane of the surface that surrounds the optically active area.

Figure 4:
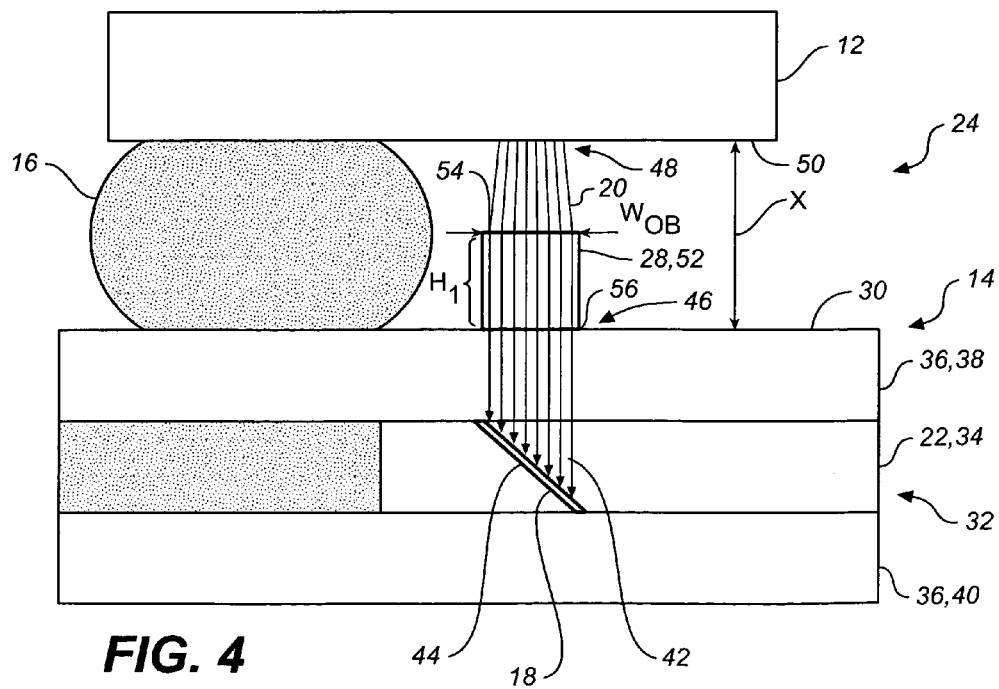
FIG. 4 is a schematic cross-sectional view of a chip coupled to a substrate with an optical bump coupled to the substrate's top surface according to a preferred embodiment, and the optical bump extends upward from the substrate's top surface only a fraction of the total distance of separation between the substrate's top surface and a bottom surface of the chip.

Referring additionally to the cross-sectional view of FIG. 4, a device 12, also referred to herein as a second device, e.g., a chip, that is coupled to the substrate 14 can include one or more electrical, optical, or electro-optical components that communicate with other devices that are mounted in the substrate, or that are external thereto, using optical and/or electrical signals that are transmitted via pathways, e.g., the waveguide 22, formed within, or on, the substrate. Thus, in addition to the optical layer 32, substrate 14 includes at least one electrical layer (not shown) having at least one electrically conductive path, e.g., a via or the like, for routing electrical signals and/or to supply electrical power to the devices that are coupled to the substrate. In FIG. 4, the chip is electrically coupled to the substrate by a solder bump 16. Although only one solder bump is shown in FIG. 4, typically, a plurality of solder bumps couple the chip to the substrate.

The waveguide 22 includes a core layer 34 that is surrounded by cladding material 36, e.g., the cladding material that is incorporated into a top cladding layer 38 and a bottom cladding layer 40 shown in FIG. 3, which has a different refractive index value than the core layer's refractive index value. The difference between the refractive index value of the waveguide's core layer and the refractive index value of the cladding layers provide for the confinement of the light 20 that propagates through the waveguide along the direction of the waveguide's central axis according to well known optical principles. The change in the refractive index value between the core material and the cladding material can be a step change or a gradual change, as in a graded-index waveguide. The selection of optical properties of the core material and the cladding material to form a waveguide is well known in the art.

In one embodiment of the present invention, the waveguide's core material 34 is a photosensitive polymer, and the cladding material 36 is a heat-curable polymer. Preferred photosensitive polymers include, but are not limited to, the following: fluorinated optical polymers, e.g., Ultradel, a polymer including a fluorinated polyimide provided by BP Amoco of London, England; XU 35121, a polymer including perfluorocyclobutene provided by Dow Chemical Company of Midland, Mich.; and fluorinated polymers manufactured by Hitachi Chemical Co, Ltd. of Tokyo, Japan. Preferred heat-curable polymers include, for example, V259EH available from Nippon Steel Chemical Co., Ltd. of Tokyo, Japan.

In alternative embodiments of the present invention, the waveguide core material 34 and the cladding material 36 are formed from the same photobleachable polymer, which is photobleached to change its refractive index value for use in either the waveguide core 22 or the cladding layers 38 and 40. In these embodiments, the waveguide core material differs from the cladding material only by virtue of the fact that the waveguide core material has been irradiated with actinic radiation, e.g., UV light, and, thereby, has undergone a change in the value of its index of refraction. Suitable photobleachable polymers include, dye-doped polymers such as P2ANA, a PPMA copolymer produced by Hoechst Celanese of Frankfurt, Germany; Glasia, a photosensitive polysilane provided by Nippon Paint Co., Ltd. of Osaka, Japan.

At one end 42 of the waveguide 22 is a mirror 18 that is optically aligned with the waveguide and the mirror, is preferably angled at 45° relative to the waveguide's central axis. The mirror is configured to redirect light 20 from propagating in a direction perpendicular to the top surface 30 of the substrate 14 to a direction along the waveguide's central axis. In embodiments of the present invention, an angled surface of the waveguide material may be inherently reflective, or a reflective coating 44, e.g., gold, may be applied to the angled surface.

In the embodiment of the present invention that is shown in FIG. 4, the top cladding layer 38 is made from a transparent material 36 that permits the propagation of light 20 through the cladding layer and to the mirror 18. The top surface 30 of the substrate where the light passes through the substrate's top surface defines a first optically active area 46.

Alternatively, an opening or aperture, may formed through the substrate's top surface 30 and the top cladding layer 38, permitting the transmission of light into the substrate 14 from an external source 12, so that it can be reflected by the mirror 18 into the waveguide 22. In these embodiments the opening, which can be formed by etching, laser drilling, or other known techniques, defines the optically active area.

In the embodiment of FIG. 4, optical bump 28 of the present invention is incorporated into the packaging interface 24 between the chip 12 and the substrate 14. However, it is not intended that the invention be limited to such a combination. While only one chip and one substrate are shown in the figures, those skilled in the art will appreciate that the optical interconnect structures of the present invention are useful for making connections between a chip, or similar device, mounted directly on another chip, i.e., the optical coupling of two or more chips, or mounted on an "interposer" substrate positioned between a chip and an optical circuit board or substrate. Also, those having skill in the art will appreciate that the optical interconnect structures of the present invention are useful for making connections between two optical circuit boards. In general, the present invention is used for forming optical connections between optically active areas on opposing surfaces of two devices, for example, in a "flip-chip" configuration, and the method of the present invention is compatible with such mounting technologies.

Chip 12 includes a light-emitting component (not shown) that projects light 20 through the second optically active area 48 in the chip's bottom surface 50. Light that is transmitted through the first optically active area 46 in the substrate's top surface 30, reflected by the mirror 18, which is optically aligned with the second optically active area, and propagated through the waveguide 22, which is optically aligned with the mirror is transmitted to a light receiving component (not shown in FIG. 4). As previously discussed, the optically active areas in the chip and the substrate can be either areas or apertures in a device or component, through which light is transmitted from a light transmitting component, e.g., a VCSEL, or through which light is received by a light receiving component, e.g., a PD.

In order to facilitate the coupling of light 20 that is emitted from the second optically active area 48 in the chip's bottom surface 50 into the first optically active area 46 in the substrate's top surface 30, the optically active areas are faced in opposition to one another. The chip's bottom surface is oriented approximately parallel to the substrate's top surface. Also, the optically active areas are spaced apart by a distance "X". The present invention is useful for a wide range of spacing between the chip's bottom surface and the substrate's top surface, for example, the distance X can range from approximately 10 µm to approximately 150 µm.

A shown in FIG. 4, an optical bump 28 is connected to the substrate's top surface 30 between the optically active areas 46 and 48 in the chip and the substrate 12 and 14, respectively, and extends upward from the substrate's top surface toward the chip's bottom surface 50 approximately half the distance X between the substrate's top surface and the chip's bottom surface. The optical bump acts as an optical waveguide that is used to receive the light 20 that is output from the chip's optically active area 48 and to guide the light to the substrate's optically active area 46. Accordingly, the optical bump forms a portion of the optical path for the transmission of light between the chip and the substrate. The optical bump is formed from an optical material, i.e., a material that is optically transparent at the wavelength(s) of light that is transmitted between the optically active areas.

It is preferred that the optical bump 28 be formed from a curable liquid polymer that has a refractive index that is higher than any surrounding material, e.g., air or a cladding material. Suitable optical polymer materials are well-known in the art and include such materials as polyurethane, polycarbonate, acrylic polymer, and vinyl polymer. Acrylic polymers such as polymers of methacrylamides or polymers of alkyl-methacrylates such as polymethyl-methacrylate ("PMMA") are useful at short wavelengths near the visible region. Other polymers that are suitable for use in the optical bump include, for example, heat-curable polymers, photosensitive polymers, and photobleachable polymers, such as those previously discussed with respect to the substrate's waveguide 22.

Photosensitive polymers, e.g., UV-curable epoxy or gel, are used to form solid features, e.g., the optical bump 28, by exposing portions of the polymer to a pattern of actinic radiation, e.g., UV light, where the pattern corresponds to desired solid features. The photosensitive polymer remains a liquid until exposed by the actinic radiation, and the polymer undergoes a change in one or more optical properties, such as the polymer's index of refraction, when exposed to the actinic radiation. The polymer can incorporate, for example, a dye, where the dye undergoes chemical changes resulting from absorption of the actinic radiation that modifies the properties of the polymer/dye mixture. The polymer can be used to create selected regions within the polymer that have different refractive index values, when the actinic radiation is applied selectively to the photosensitive polymer. The unexposed polymer is then etched away to leave cured polymer in the desired configuration that is dictated by the pattern.

During processing of the optical bump 28, a layer of liquid polymer is first deposited onto the substrate's top surface 30. The polymer is applied using techniques known in the field, such as spin coating or curtain coating. After coating, the polymer is partially cured to make the material, which is a liquid when deposited, sufficiently solid with which to work. Partially curing can be performed by soft baking. Depending on the polymer, soft baking is typically in the range of from approximately 80° C. to approximately 100° C.

Next, the polymer layer, in particular, a photosensitive polymer layer, is exposed to patterned actinic radiation, e.g., UV light, to further cure selected areas of the polymer. Selective curing of portions of the polymer that correspond to the desired location of the optical bump 28 is accomplished by exposing regions of the polymer layer above the substrate's optically active area 46 to the actinic radiation using a mask. In other embodiments, selective curing the polymer layer above the substrate's optically active area is facilitated by the propagation of UV light thorough the waveguide 22 and out through the first optically active area in the substrate's surface 30.

The wavelength of the actinic radiation and the length of exposure time of the polymer to the actinic radiation depends upon the bleaching properties of the polymer and the required change in refractive index. After the actinic radiation curing step, any unexposed polymer, i.e., uncured polymer, is removed, such as by wet etching, leaving the optical bump 28. The remaining polymer is then heat cured, for example by heating the polymer to a temperature typically from approximately 150° C. to approximately 180° C.

After the curing process steps, the cured polymer is polished to form a polished surface, where the polishing can be performed by mechanical polishing, or more preferably by chemical mechanical polishing. The height "$H_1$" of the optical bumps 28 can be adjusted and made uniform during the polishing step. As each optical bump is polished, the optical bump's top surface 54 is ground flat and the height of the optical bump is reduced. Polishing reduces light scattering from the optical bump's top surface, thereby enhancing the coupling of the beam 20 into the optical bump. After the optical bump is polished, the chip 12 and the substrate 14 are positioned so the chip's optically active area 48 is aligned with the optical bump, and the chip's optically active area is spaced apart from, and opposed to, the substrate's optically active area 46.

The optical bump 28 can be formed from the same manufacturing processes, e.g., photolithography or the like, that are used to make the substrate's waveguide and mirror. In particular, during fabrication, a predetermined amount of liquid polymer is deposited on the substrate's top surface 30 adjacent to the substrate's optically active area 46, such that a region of the substrate's top surface is coated with the liquid polymer. Then, a portion of the liquid polymer is cured, preferably by exposure to UV light or heat. When the liquid polymer is heated, the temperature at which the polymer cures depends upon the polymer, and can range from a temperature of approximately 20° C. to an elevated temperature of up to approximately 200° C. that is maintained for several minutes or possibly many hours. After a portion of the liquid polymer is cured, the uncured portion is removed, exposing the cured portion of the liquid polymer in the form of the optical bump.

Because the process for forming the optical bump 28 includes materials that can be used to fabricate other components, e.g., the waveguide 22, in the substrate 14, and the process for forming the optical bump uses processes that also can be used to fabricate portions of the substrate, there is little impact on the overall material cost, or any additional processing difficulty associated with adding the optical bump processing steps to the overall processing steps associated with the substrate manufacturing process.

The end 56 of the optical bump 28 that contacts the substrate's top surface 30 preferably covers an area equal to, or larger than, the first optically active area 46 in the substrate 14. In preferred embodiments of the present invention, a transverse cross-sectional shape, i.e., the shape of a cross section taken in a direction parallel to the plane of the substrate's surface proximate the substrate's optically active area, for the optical bump is approximately circular. In other embodiments, the transverse cross-sectional shape of the optical bump can take on other shapes, for example, an ellipse, a square, or a rectangle. Also, ideally, the preferred shape of the optical bump in longitudinal cross section, as shown in the figures, is a cylinder. However, the optical bump can have a longitudinal cross section of a shape other than a cylinder.

Figure 5:
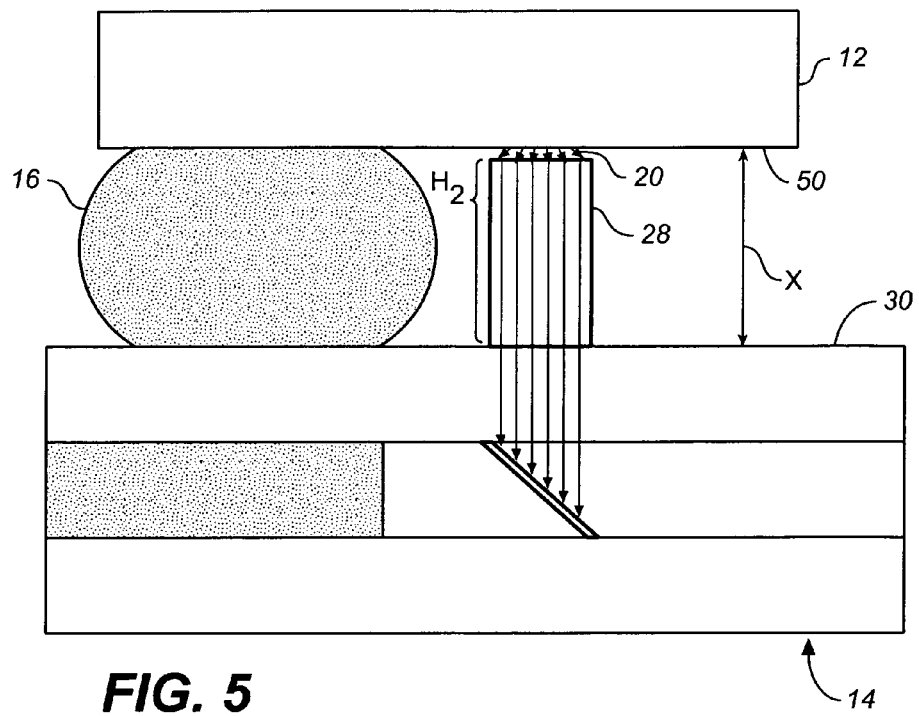
FIG. 5 is a schematic cross-sectional view of a chip coupled to a substrate with an optical bump coupled to the substrate's top surface according to a preferred embodiment, and the optical bump extends upward from the substrate's top surface a majority of the total distance of separation between the substrate's top surface and the chip's bottom surface.

As shown in FIG. 4, the optical bump 18 has a height "$H_1$" that is less than the total distance, X, between the chip's bottom surface 50 and the substrate's top surface 30, so long as the width, "$W_{OB}$", of the optical bump's top surface 54 and the height, $H_1$, of the optical bump is such that the optical beam 20 does not diverge to a width greater than the width $W_{OB}$ of the optical bump's top surface. For example, an optical bump having a height $H_1$ of approximately 40 μm can guide the light from the optical beam without significant loss when the total distance of separation X between the chip's bottom surface and the substrate's top surface is approximately 80 μm. Referring additionally to FIG. 5, the optical bump can have another height "$H_2$" that is just slightly lower than the distance of separation X between the chip's bottom surface and the substrate's top surface, in order to maximize the light guiding effect offered by the optical bump.

In addition to the optical interfaces 24 discussed herein, the chip 12 is electrically coupled to the substrate 14. More specifically, the chip can be electrically connected to the substrate using conductors 16 in the form of, for example, solder bumps, posts, or similar structures, to provide electrical connections between the chip and the substrate, as are known in the art.

Advantageously, the optical bumps 28 according to the present invention are shorter in height than the height X of the solder bumps 16 (only one shown) that electrically couple the chip 12 to the substrate 14, and thus, the optical bumps do not interfere with, or obstruct, the process of adding the solder bumps between the chip and the substrate, i.e., the solder bumping process. Moreover, during processing of the optical bumps, the optical bumps are built on the substrate's top surface 30 and cured before the solder bumping processing steps, and thus, the process of building the optical bumps on the substrate's top surface does not adversely affect the solder bumping process due to any thermal processing steps associated with the formation of the optical bumps.

Figure 6:
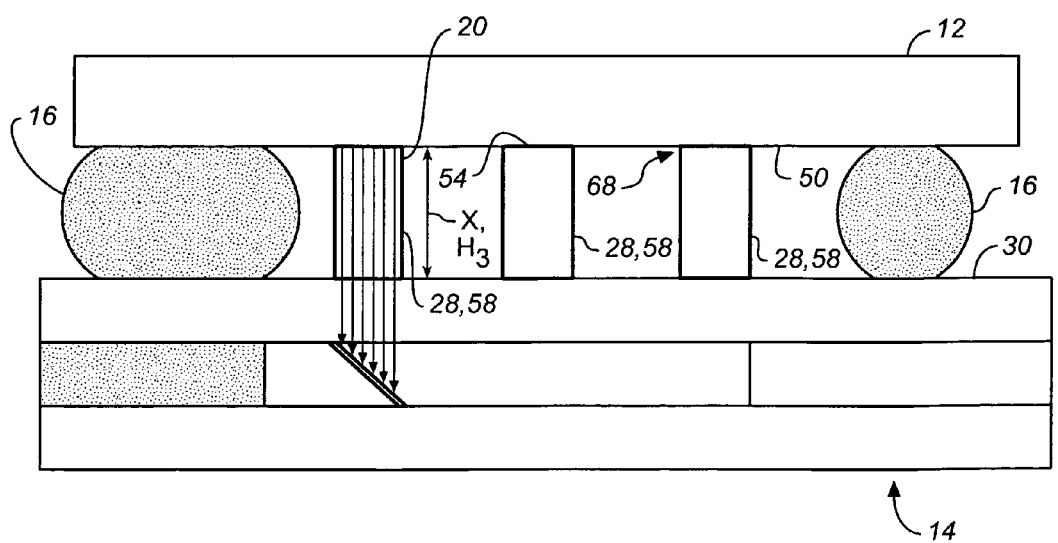
FIG. 6 is a schematic cross-sectional view of a chip coupled to a substrate with three optical bumps coupled to the substrate's top surface according to a preferred embodiment, and the three optical bumps extend upward from the substrate's top surface to cover the total distance of separation distance between the substrate's top surface and the chip's bottom surface.

Referring additionally to FIG. 6, more than one optical bump 28 can be formed on the substrate's top surface 30, and the optical bumps can extend from the substrate's top surface, also referred to as "the floor," to the chip's bottom surface 50, also referred to as "the ceiling." Accordingly, "floor-to-ceiling" optical bumps 58 extend the full distance from the substrate's top surface to the chip's bottom surface, and thus, the optical bumps contact both the substrate 14 and the chip 12. Although three optical bumps are shown in FIG. 6, any convenient number of optical bumps can be coupled to the substrate's top surface.

Floor-to-ceiling optical bumps 58, as shown in FIG. 6, advantageously can act as stand-offs between the chip 12 and the substrate 14, thus, spacing the chip apart from the substrate. Thus, the floor-to-ceiling optical bumps can, in effect, control the height X of the solder joints 16, e.g., the solder bumps, between the chip and the substrate. In many situations it is desirable to increase the separation of components that are flip-chip bonded beyond the separation that would exist if the solder bumps were allowed to fully collapse. Therefore, the floor-to-ceiling optical bumps can facilitate the flip-chip bonding process for the electrical joints between the chip and substrate. Also, because the chip's bottom surface 60 rests on the top surface 54 of the floor-to-ceiling optical bumps, the chip's bottom surface automatically rests in a level and approximately parallel position relative to the substrate's top surface 30. Thus, the floor-to-ceiling optical bumps eliminate the need for precise control of the approximately parallel spacing, i.e., parallelism, between the chip's bottom surface and the substrate's top surface, during the flip-chip bonding process.

When the floor-to-ceiling optical bumps 58 act as stand-offs between the chip 12 and the substrate 14, the uniformity of the size of the solder bumps 16 that are deposited on either the substrate or the chip before the substrate and chip are coupled together, becomes less important, because the leveling of the chip's bottom surface 50 relative to the substrate's top surface 30 is not controlled by the buoyancy of the solder bumps. Rather, the leveling of the chip's bottom surface relative to the substrate's top surface is controlled by the uniformity of the height "$H_3$" of the floor-to-ceiling optical bumps. This feature that is related to the use of the floor-to-ceiling optical bumps as stand-offs between the chip and the substrate allows for the solder bumping process, and other electroplating and/or sputtering processes related to the position of electrical contacts on the chip's bottom surface and/or the substrate's top surface, to have a greater tolerances, resulting in greater overall yields for the combination of the chip and the substrate.

In the case of floor-to-ceiling optical bumps 58, the top surface 54 of the optical bump can be bonded to the chip's bottom surface 50, by, for example, applying a very thin layer of heat curable optical polymer on one of the surfaces to be joined, and then curing the thin layer of polymer after the chip 12 has been aligned with the optical bump(s) 58. Preferably, the bonding layer is less than 1 µm thick. Optionally, an adhesive can be placed on the top surface of the optical bump for bonding the optical bump's top surface to the chip's bottom surface. However, bonding the optical bumps to the bottom surface of the chip may prevent reworking of the connection.

Figure 7:
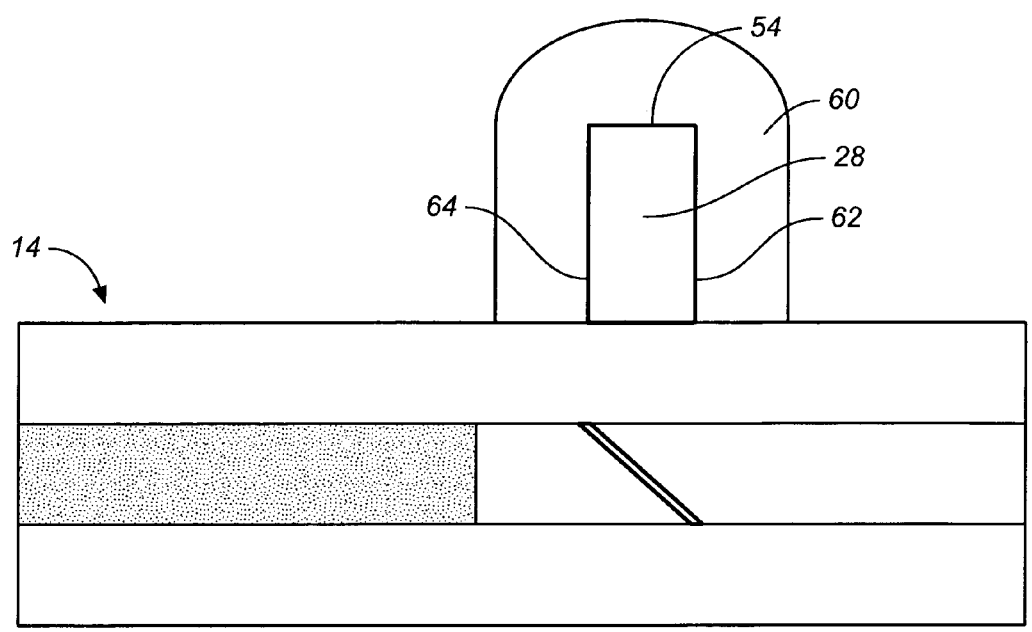
FIG. 7 is a schematic cross-sectional view of an optical bump that is coated with a cladding material and coupled to the substrate's top surface according to a preferred embodiment.
Figure 8:
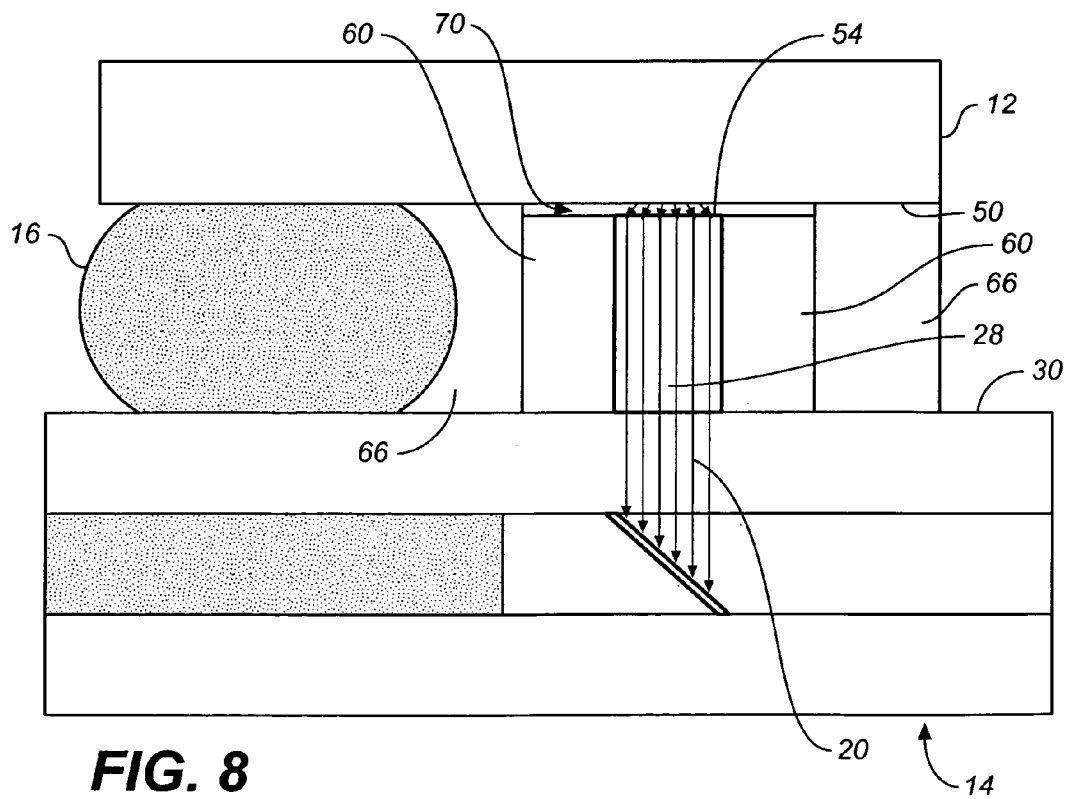
FIG. 8 is a schematic cross-sectional view of a chip coupled to a substrate with an optical bump coupled to the substrate's top surface according to a preferred embodiment, the optical bump extends upward from the substrate's top surface a majority of the total distance of separation between the substrate's top surface and the chip's bottom surface, the optical bump is coated with a cladding material, and underfill material is located between the substrate and the chip.

In the exemplary embodiments shown in FIGS. 3-6, the optical bumps 28 are surrounded by air. In contrast, FIGS. 7 and 8, show a cladding material 60 surrounding at least a portion of the exterior surfaces 54, 62, and 64 of the optical bump. The cladding material that is added to the optical bump can be any suitable optical grade polymer. The cladding material can be processed using standard coating and lithography processes. Polishing may be used, if necessary, to remove the cladding layer from the top surface 54 of the optical bumps and to planarize the top surface, as shown in the cross-sectional view of FIG. 8.

Cladding 60 may be added to the optical bump 28 to prevent underfill 66 from contacting the optical bump. Underfill is often disposed between the chip and the substrate 14 to bond the chip to the substrate and to reinforce the solder connections 16. Alternatively, where no cladding is used, any underfill material should have optical properties which do not interfere with the transmission of light through the optical bump. In such cases, the underfill should be chemically compatible with the bump material, not light absorbing and have a refractive index lower than the material used to fabricate the optical bump. Many currently used underfill materials are not of an optical grade, such that use of a cladding material surrounding the optical bumps is desirable.

When underfill 66 is added between the chip 12 and the substrate 14 after the solder bumping process, the underfill is allowed fill the space between the chip and the substrate. However, as long as the optical bump 28 is tall enough to leave no gap 68, or only a small gap 70, between the chip's bottom surface 50 and the optical bump's top surface 54, see FIGS. 6 and 8, respectively, the underfill will not flow in between the chip and the optical bump. When only a small gap is left between the chip's bottom surface and the optical bump's top surface, the underfill typically will not flow into the space between the chip and the optical bump due to the surface tension of the underfill. Thus, the underfill will not flow between the chip and the optical bump, and the optical path between the chip and the optical bump will remain unimpeded, as shown in FIG. 8. Even when no underfill is disposed between the chip and the substrate, it may be advantageous for cladding material 60 to be placed around the optical bump to prevent flux residues, generated as a result of the soldering process, from depositing on the optical bump and adversely affecting the coupling of light 20 into, and the transmission of light through, the optical bump.

Figure 9:
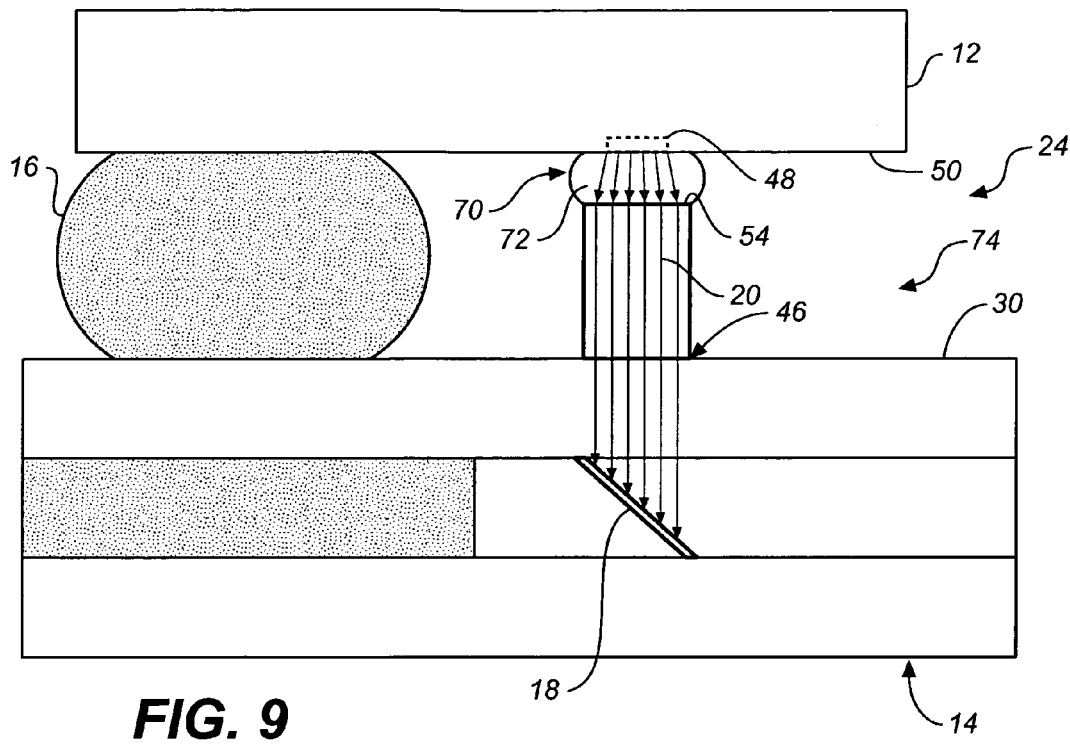
FIG. 9 is a schematic cross-sectional view of a chip coupled to a substrate with an optical bump coupled to the substrate's top surface according to a preferred embodiment, the optical bump extends upward from the substrate's top surface a majority of the total distance of separation between the substrate's top surface and the chip's bottom surface, and a gel is coupled between the chip's bottom surface and the optical bump.
Figure 10:
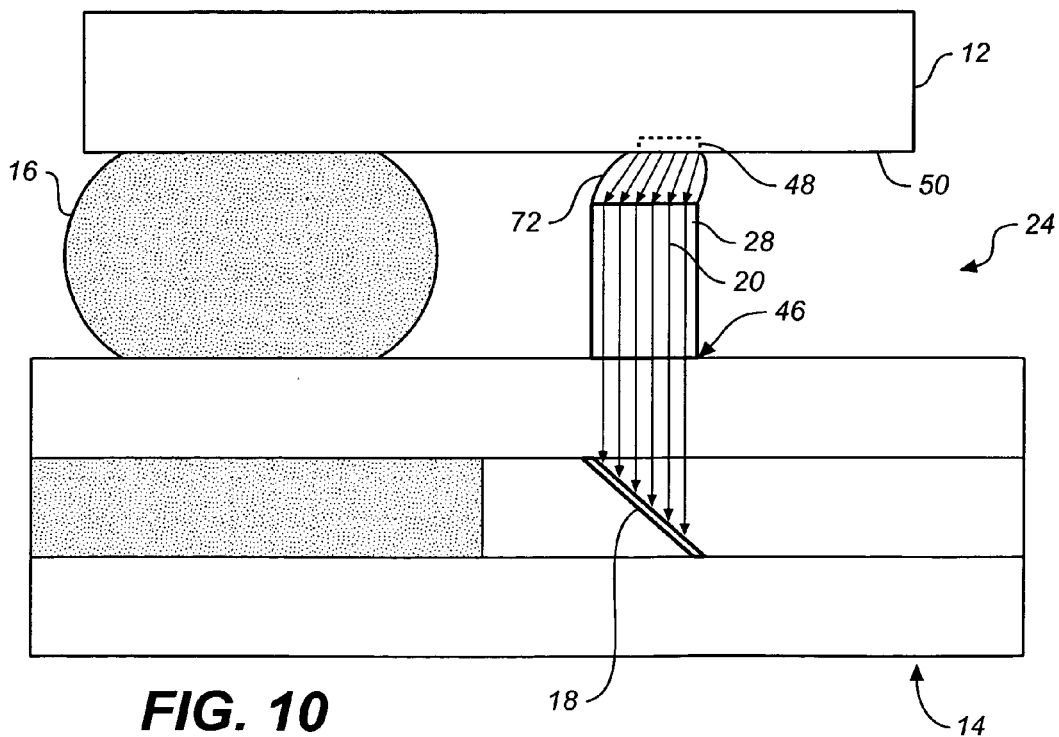
FIG. 10 is a schematic cross-sectional view of a chip coupled to a substrate with an optical bump on the substrate's top surface according to a preferred embodiment, the optical bump extends upward from the substrate's top surface a majority of the full distance of separation between the substrate's top surface and the chip's bottom surface, a gel is coupled between the chip's bottom surface and the optical bump, and an optically active area in the chip's bottom surface is not aligned with an optically active area in the substrate's top surface.

Referring additionally to FIGS. 9 and 10, an optical gel 72 is used to fill the gap 70 between the chip's bottom surface 50 and the optical bump's top surface 54. Thus, the addition of the gel to the optical bump 28 results in a floor-to-ceiling optical joint 74 between the chip 12 and the substrate 14. Advantageously, the gel prevents the buildup of moisture and dust particles in the optical path between the chip's bottom surface 50 and the optical bump's top surface 54, and thus, maintains a clear optical signal path between the chip and the optical bump. Thus, the combination of the gel and the optical bump prevents foreign particles from blocking the light's path between the optically active areas 46 and 48 in the substrate and the chip, respectively. Preferably, the gel is an index matching fluid ("IMF").

In the case of a non-cured, soft gel 72, the gel's surface tension determines the shape the gel assumes between the chip's bottom surface 50 and the optical bump 28, so the amount of gel dispensed between the chip 12 and optical bump must be controlled during processing. Using a soft gel allows for the rework of the optical interface 24 between the chip and substrate 14.

As shown in FIG. 10, gel 72 can offer some self-alignment capability when the second optically active area 48 in the chip's bottom surface 50 is not aligned with the optical bump 28 and the substrate's mirror 18 during packaging, or after packaging process is complete, the chip 12 shifts relative to the optical bump. The gel can accommodate some lateral motion, and the deformation of the gel in response to lateral motion of the chip relative to the substrate 14 does not appreciably affect the performance of the optical interface 24 between the first and second optically active areas 46 and 48, respectively, because the light 20 output from the chip's optically active area 48 is guided into the optical bump due to the total internal reflection within the gel. Thus, embodiments of the present invention advantageously provide self-alignment capability for the optical interface between the chip and the substrate.

It is noted that processing requires that the is dispensed before flip-chip bonding, and it needs to survive the flip-chip bonding process.

Advantageously, many of the aforementioned exemplary embodiments do not include a permanent optical connection between the chip 12 and the substrate 14, and therefore, the optical coupling schemes according to the embodiments of the present inventions allow for the reworkability of the interface 24 between the chip and the substrate. Also, the optical interfaces between the chip and the substrate in the exemplary embodiments advantageously can be reworked in the same manner as rework that is typically performed on microelectronic packages. For example, the solder 16 between the chip and the substrate need only be melted, and the chip detached from the substrate. Then, a new chip or new substrate can be added to the chip/substrate configuration.

As noted, unless it is used as stand off, optical bump 28 need not extend the full distance X from the chip's bottom surface 50 to the substrate's top surface 30, rather, optical bump need be only tall enough to capture the light 20 output from the chip's optically active area 48 before the width of the light beam W diverges wider than the width $W_{OB}$ of the optical bump's top surface 54. Accordingly, because the height $H_1$ and $H_2$ of the optical bump need not extend the full distance X between the chip's bottom surface and the substrate's top surface, embodiments of the optical bump have the added advantage of not interfering with the solder bumping process of the chip 12 and the substrate 14.

Also, because certain of the optical bumps 28 in these exemplary embodiments do not contact the chip's bottom surface 50, the optical bumps are not at risk of cracking from residual stress that occurs after the assembly of the chip/substrate interface 24 due to creeping and relaxation of the material included in the solder bumps 16 and other chip/substrate interface components. Thus, these optical bumps offer a highly reliable optical interface between the chip and the substrate.

In other exemplary embodiments of the present invention, the optical bumps 58 extend the full distance X between the chip's bottom surface 50 and the substrate's top surface 30, and these optical bumps advantageously can act as stand-offs that are used to control the spacing between the chip 12 and substrate 14, and thus, the height of the solder joints 16 in the chip/substrate interface 24. Also, in these exemplary embodiments, the optical bumps advantageously can act to level the chip relative to the substrate, ultimately resulting in the chip's bottom surface and the substrate's top surface being positioned in a approximately parallel configuration.

Another advantage associated with the aforementioned exemplary embodiments is that the optical bumps 28 confine the light 20 as it propagates between the chip 12 and the substrate 14, thus, minimizing optical signal loss, without the use of microlenses 26, which can be expensive.

Also, the optical bumps 28 can be fabricated from the same materials, and using the same processes, that are used to manufacture the waveguide 22 and mirror 18 included in the substrate 14. Accordingly, the optical bump's fabrication process does not have a significant impact on the material cost or the processing difficult associated with the fabrication of the substrate.

The present invention thus provides an apparatus and method for coupling optical components. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. For example, while the present invention describes the use of certain optical polymers, other polymers, or combinations of polymers, can be use. Also, while the optical bumps 28, in all of the figures, are shown built on the substrate 14, the optical bumps can be built on the surface of another device, e.g., the chip 12. Accordingly, the disclosures and descriptions herein are intended to be illustrative, but not limiting, of the scope of the invention, which is set forth in the following claims.

What is claimed is:

1. An apparatus comprising:
a substrate having a first surface including at least one first optically active area;
a device substantially supported by the substrate, the device having a second surface including at least one second optically active area positioned in a spaced-apart and opposed relationship with respect to the at least one first optically active area, the first surface separated from the second surface by a distance;
at least one optical bump coupled to and in contact with the first surface and positioned between the first optically active area and the second optically active area, the at least one optical bump having a height less than the distance between the first surface and the second surface, the at least one optical bump having a surface facing the second optically active area that is substantially flat, and the at least one optical bump configured to couple light between the at least one second optically active area and the at least one first optically active area; and
at least one solder bump that contacts both the first surface and the second surface.

2. The apparatus of claim 1, wherein:
the first surface and the second surface are oriented approximately parallel to one another; and
the distance between the first surface and the second surface ranges from approximately 10 µm to approximately 150 µm.

3. The apparatus of claim 1, wherein:
the device is configured to transmit light from the at least one second optically active area; and
the at least one optical bump is configured to receive the light output from the device through the at least one second optically active area, and to couple the light into the substrate through the at least one first optically active area.

4. The apparatus of claim 1, further comprising a gel coupled between the second surface and the at least one optical bump.

5. The apparatus of claim 4, wherein the gel is an index matching fluid.

6. The apparatus of claim 4, wherein:
the device is configured to transmit light from the at least one second optically active area; and
the gel is configured to couple the light transmitted from the at least one second optically active area into the at least one optical bump, when the at least one second optically active area is not aligned with the at least one first optically active area.

7. The apparatus of claim 1, further comprising a cladding layer formed from a cladding material that covers at least a portion of the at least one optical bump.

8. The apparatus of claim 7, wherein the cladding material is an optical grade polymer.

9. The apparatus of claim 7, further comprising underfill located between the first surface and the second surface, wherein the cladding layer prevents the underfill from contacting the at least one optical bump.

10. The apparatus of claim 1, wherein the at least one optical bump is formed from a curable polymer selected from the group consisting of polyurethane, polycarbonate, acrylic polymer, vinyl polymer, heat-curable polymer, photosensitive polymer, and photobleachable polymer.

11. The apparatus of claim 1, wherein:
the device is configured to transmit light from the at least one second optically active area;
the substrate includes:
a mirror optically aligned with the at least one first optically active area, and a waveguide optically aligned with the mirror and configured to facilitate the propagation of light; and
the light that is transmitted from the at least one second optically active area and coupled into the first device through the first optically active area is reflected from the mirror and coupled into the waveguide.

12. An apparatus comprising:
a substrate having a first surface including at least one first optically active area;
a device configured to be electrically coupled to the substrate and substantially supported by the substrate, the device having a second surface including at least one second optically active area positioned in a spaced-apart and opposed relationship with respect to the at least one first optically active area;

at least one optical bump coupled to the first surface between the at least one first optically active area and the at least one second optically active area; and at least one solder bump that contacts both the first surface and the second surface of the second device and that electrically couples the substrate to the device;

wherein the at least one optical bump extends from the first surface to the second surface, and the at least one optical bump is rigid and configured both to couple light between the at least one second optically active area and the at least one first optically active area, and to act as a stand-off between the first surface and the second surface when the device is electrical coupled to the substrate by the at least one solder bump.

13. The apparatus of claim 12, wherein the at least one optical bump is configured to space the device apart from the substrate so that the second surface is approximately parallel to the first surface.

* * * * *

UNITED STATES PATENT AND TRADEMARK OFFICE
CERTIFICATE OF CORRECTION

| | |
|---|---|
| PATENT NO. | : 7,453,058 B2 |
| APPLICATION NO. | : 11/080200 |
| DATED | : November 18, 2008 |
| INVENTOR(S) | : Michael G. Lee et al. |

It is certified that error appears in the above-identified patent and that said Letters Patent is hereby corrected as shown below:

Col. 17, Ln. 5 Claim 12: After "second surface" delete "of the second device"

Signed and Sealed this

Twentieth Day of October, 2009

David J. Kappos
*Director of the United States Patent and Trademark Office*